US011074968B2

(12) United States Patent
Sethuraman et al.

(10) Patent No.: US 11,074,968 B2
(45) Date of Patent: Jul. 27, 2021

(54) METHOD AND SYSTEM TO IMPROVE READ RELIABILITY IN MEMORY DEVICES

(71) Applicant: International Business Machines Corporation, Armonk, NY (US)

(72) Inventors: Saravanan Sethuraman, Bangalore (IN); Karthick Rajamani, Austin, TX (US); Venkata K. Tavva, Hyderabad (IN); Hillery Hunter, Chappaqua, NY (US); Chitra Subramanian, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/692,263

(22) Filed: Nov. 22, 2019

(65) Prior Publication Data

US 2021/0158866 A1   May 27, 2021

(51) Int. Cl.
*G11C 11/56* (2006.01)
*G11C 11/406* (2006.01)

(52) U.S. Cl.
CPC .... *G11C 11/5607* (2013.01); *G11C 11/40626* (2013.01); *G11C 11/5628* (2013.01); *G11C 11/5642* (2013.01)

(58) Field of Classification Search
CPC ................................................. G11C 11/5607
See application file for complete search history.

(56) References Cited

U.S. PATENT DOCUMENTS

| | | | |
|---|---|---|---|
| 6,958,929 B2* | 10/2005 | Abraham | ............ G11C 11/1675 |
| | | | 365/158 |
| 9,142,277 B2 | 9/2015 | Kim et al. | |
| 9,406,368 B2 | 8/2016 | Bose et al. | |
| 9,431,084 B2 | 8/2016 | Bose et al. | |

(Continued)

FOREIGN PATENT DOCUMENTS

| | | | |
|---|---|---|---|
| CN | 103456356 A | 12/2013 | |
| CN | 103810119 A | 5/2014 | |

(Continued)

OTHER PUBLICATIONS

Zhang, L., et al., "Addressing the Thermal Issues of STT-MRAM From Compact Modeling to Design Techniques", IEEE Transactions on Nanotechnology, Mar. 2018, pp. 345-352, vol. 17, Issue 2.

(Continued)

*Primary Examiner* — Douglas King
(74) *Attorney, Agent, or Firm* — Scully, Scott, Murphy & Presser, P.C.

(57) ABSTRACT

A system and method for storing data that includes at least one memory device having a plurality of memory cells for storing data; and a memory control circuit that manages the read current and read pulse width applied to the memory cells, wherein the at least one memory device has a read current circuit configured to utilize adjustments to at least one of the read current or the read pulse width applied to the memory cells. In response to a request to read a group of the memory cells, the memory control circuit in an example, in response to determining that a comparative temperature value exceeds a first threshold, is configured to perform at (Continued)

least one of reducing the read current and/or increasing the read pulse width to be applied to the group of memory devices to be read.

18 Claims, 6 Drawing Sheets

(56) References Cited

U.S. PATENT DOCUMENTS

| | | | |
|---|---|---|---|
| 9,543,005 B2 | 1/2017 | Guliani et al. | |
| 9,734,885 B1* | 8/2017 | Healy | G11C 11/1673 |
| 9,761,294 B1 | 9/2017 | Healy et al. | |
| 2010/0290280 A1* | 11/2010 | Seo | G11C 11/1673 365/171 |
| 2011/0103140 A1* | 5/2011 | Chung | G11C 13/004 365/163 |
| 2015/0206567 A1 | 7/2015 | Bose et al. | |
| 2018/0144782 A1 | 5/2018 | Noguchi et al. | |

FOREIGN PATENT DOCUMENTS

| | | |
|---|---|---|
| CN | 108109660 A | 6/2018 |
| CN | 108735252 A | 11/2018 |

OTHER PUBLICATIONS

Zhao, W.S., et al., "Failure and reliability analysis of STT-MRAM", Microelectronics Reliability (2012), Received Jun. 3, 2012, Accepted Jun. 15, 2012, Available online Jul. 6, 2012, pp. 1848-1852, vol. 52.
Kang, W., et al., "Yield and Reliability Improvement Techniques for Emerging Nonvolatile STT-MRAM", IEEE Journal of Emerging and Selected Topics in Circuits and Systems, Mar. 2015, pp. 28-39, vol. 5, No. 1.
Swaminathan, K., et al., "Towards Resilient Micro-Architectures: Datapath Reliability Enhancement using STT-MRAM", 2011 IEEE Computer Society Annual Symposium on VLSI, Jul. 2011, pp. 236-241.
Sun, G., et al., "An Energy-Efficient 3D Stacked STT-RAM Cache Architecture for CMPs", 2014, https://www.springerprofessional. de/en/an-energy-efficient-3d-stacked-stt-ram-cache-architecture-for-cm/1758836, Accessed on Jan. 14, 2020, 1 page (Abstract only).
Jiang, L., et al., "Improving Read Performance of STT-MRAM based Main Memories through Smash Read and Flexible Read", 2016 21st Asia and South Pacific Design Automation Conference (ASP-DAC), Jan. 2016, pp. 31-36.
International Search Report dated Feb. 3, 2021 received in a corresponding foreign application, namely International Patent Application No. PCT/IB2020/059891, 9 pages.

* cited by examiner

METHOD AND SYSTEM TO IMPROVE READ RELIABILITY IN MEMORY DEVICES

BACKGROUND

The present invention relates to memory systems and devices including magnetic random access devices (MRAM), more particularly improvements to the reliability of MRAM.

With recent advancement of information technology and wide use of the Internet to store and process information, more and more demands are placed on the acquisition, processing, storage and dissemination of information by computing systems. Computing systems are being developed to increase the speed at which the computers are able to execute increasingly complex applications for business purposes, personal use, and entertainment. Overall computer system performance is affected by each of the key elements of the computer structure, including the performance/structure of the processors, any memory caches, input/output (I/O) subsystems, efficiency of the memory control functions, the performance of the memory devices and memory subsystems, and any associated memory interface elements, and the type and structure of the memory interconnect interfaces.

The constantly increasing speed of processors which execute increasingly complex applications places more rigorous performance demands on all of the other subsystems in the computer, including the memory devices and memory subsystem, where data is stored, accessed, and updated numerous times during the operation of a software application. A computer's memory subsystem often comprises memory modules, usually one or more dual in-line memory modules (DIMMs) that typically have a number of memory devices. The performance of the memory subsystem is affected by the performance of its memory devices.

Memory is one of the more important components used in information handling systems, computer systems, storage solutions, and mobile devices. Performance, scalability, reliability, and cost of memory devices is a major criteria in determining success or failure of such devices. Typically, nearly all information handling systems, computer systems, storage solutions, mobile devices, and other computing based products use one or a combination of charge based volatile memories, such as for example, DRAM, and/or non-volatile memories, such as for example NAND flash. Magnetic random access memory (MRAM) devices are a non-volatile memory (NVM) that may have application in information handling systems, computing systems, storage solutions, and mobile devices.

Spin Transfer Torque (STT) magnetic random access memory (STT-MRAM) devices are a type of MRAM. STT-MRAM may be suited for mainstream applications as it delivers the high performance of DRAM (and SRAM), has the low power and low cost of flash memory, scales well below 10 nm, and leverages existing CMOS manufacturing techniques. STT-MRAM is a persistent type memory, e.g., non-volatile, and will retain its data even when power is lost or completely turned off. STT-MRAM exhibits DRAM performance, persistency, with the endurance of non-volatile memories, however, STT-MRAM struggles with reliability issues. Thermal stability of a STT-MRAM chip is a key factor when considering reads, data retention, and also writes to the memory cell. In particular, as temperature increases, reliability decreases with corresponding bit error rate (BER) increases. Issues with respect to reading the cells increase, and data retention time is lowered, as temperature rises.

SUMMARY

The summary of the disclosure is given to aid understanding of the memory devices and memory systems, architectural structure, and methods of fetching (e.g., reading) data, and not with an intent to limit the disclosure or the invention. The present disclosure is directed to a person of ordinary skill in the art. It should be understood that various aspects and features of the disclosure may advantageously be used separately in some instances, or in combination with other aspects and features of the disclosure in other instances. Accordingly, variations and modifications may be made to the memory devices and memory systems, the architectural structure, and their method of operation to achieve different effects.

In one or more embodiments, a memory system for storing data is disclosed. The memory system includes at least one memory device having one or more memory cells for storing data; and a memory control circuit that manages the read current and read pulse width applied to the at least one memory device to read data stored in the at least one memory device. The memory control circuit in an aspect outputs memory access commands including memory read commands to the at least one memory device. The at least one memory device in an embodiment has a read current circuit configured to utilize adjustments to at least one of the read current or the read pulse width applied to the one or more memory cells within the at least one memory device. The memory device in one or more embodiments includes an array or three dimensional (3D) stack of STT-MRAM memory cells. In response to a request to read a plurality of the memory cells, the memory control circuit in response to determining that a comparative temperature value exceeds a first threshold, is configured to perform at least one of reducing the read current to be applied to the at least one memory device or increasing the read pulse width to be applied to the plurality of memory devices to be read. In a further embodiment, in response to the comparative temperature value exceeding the first threshold, the memory control circuit is configured to both reduce the read current and increase the read pulse width applied to the at least one memory device containing the plurality of memory cells to be read. The first threshold preferably is programmable and dynamic, but can be predetermined and/or fixed. Determining whether a comparative temperature value exceeds a first threshold in an embodiment includes comparing in the memory controller the comparative temperature value to the first threshold.

The system in an aspect is configured to determine the comparative temperature value. Determining the comparative temperature value includes in an aspect taking a temperature measurement of at least one of the plurality of memory cells to be read or taking a temperature measurement of the at least one memory device containing the plurality of memory cells to be read, and in an embodiment using a look-up table to obtain the comparative temperature value. The system in a further aspect has a thermal sensor, and determining the comparative temperature value utilizes measurements from the thermal sensor. Determining the comparative temperature value in an embodiment is based upon the read frequency of the at least one memory device containing the plurality of memory cells to be read. Determining the comparative temperature value in one or more embodiments is based upon the temperature of at least one of the memory cells to be read or the temperature of the at least one memory device containing the plurality of memory cells to be read. In an example embodiment, the read current is reduced between about ten percent (10%) and about twenty five percent (25%), and/or the read pulse width is reduced between about ten percent (10%) and about twenty-five percent (25%). In an embodiment the at least one memory device includes an array of STT-MRAM cells, and in an aspect the plurality of memory devices are contained on a dual inline memory module (DIMM), and in an alternative embodiment in a solid state drive (SSD). The memory control circuit in an aspect is contained on a chip separate from the at least one memory device.

The memory control circuit in one or more embodiments is configured to: in response to determining that the temperature comparative value exceeds a first threshold, perform at least one of reducing the read current applied to the at least one memory device to a first reduction level or increasing the read pulse width applied to the at least one memory device to a first enlargement level; and in response to determining that the temperature comparative value exceeds a second threshold, perform at least one of reducing the read current applied to the at least one memory device to a second reduction level or increasing the read pulse width applied to the at least one memory device to a second enlargement level. In an alternative embodiment, the memory control circuit is configured to: in response to determining that the temperature comparative value does not exceed a first threshold, reduce the read current applied to the at least one memory device to a first read reduction level and reduce the read pulse width applied to the at least one memory device to a first pulse width reduction level to conserve power; in response to determining that the temperature comparative value exceeds the first threshold, apply read current to the at least one memory device at a normal level and apply read pulse width to the at least one memory device at a normal level; and in response to determining that the temperature comparative value exceeds a second threshold higher than the first threshold, perform at least one of reducing the read current applied to the at least one memory device to a second read reduction level or increasing the pulse width to a first pulse width enlargement level.

The system includes in one or more embodiments at least one Spin-Transfer Torque—magnetic random access memory (STT-MRAM) device having a plurality of memory cells for storing data, wherein the at least one STT-MRAM device has a read current circuit configured to read the plurality of memory cells using more than one read current and more than one read pulse width; and a memory control circuit that manages the read current and read pulse width to be applied to the at least one STT-MRAM device to read data stored in the at least one STT-MRAM device. The memory control circuit in an aspect has computer readable storage medium having program instructions that when executed by the memory control circuit, in response to a request to read data from a group of the plurality of memory cells, causes the memory control circuit to: obtain a comparative temperature value for the group of memory cells; determine whether the comparative temperature value is above a first threshold value; and in response to determining that the comparative temperature value is above the first threshold value, reduce the read current and increase the read pulse width to be applied to the group of memory cells to be read. The STT-MRAM in an aspect has computer readable storage medium having program instructions that when executed by the STT-MRAM cause the STT-MRAM to read the group of memory cells by applying the reduced read current and increased read pulse width to the group of memory cells. The memory control circuit in an embodiment further has program instructions that when executed by the memory control circuit causes the memory control circuit to obtain the comparative temperature value for the group of memory cells by obtaining a temperature measurement for at least one of the group of memory cells or the at least one STT-MRAM device containing the group of memory cells, and perform a look-up in a look-up table for the comparative temperature value corresponding to the temperature measurement.

A method for reading data stored in a plurality of memory cells contained in a memory device is also disclosed. The memory device preferably includes an STT-MRAM array or 3D stack of memory cells. The method includes obtaining a comparative temperature value for the plurality of memory cells; determining whether the comparative temperature value is above a first threshold value; in response to determining whether the comparative temperature value is above the first threshold value, performing at least one of reducing the read current or increasing the read pulse width to be applied to the plurality of memory cells; and reading the plurality of memory cells by applying at least one of the reduced read current or increased read pulse width to the plurality of memory cells. The method in an embodiment includes, in response to determining that the comparative temperature value is above the first threshold value, reducing the read current and increasing the read pulse width to be applied to the plurality of memory cells; and reading the plurality of memory cells by applying the reduced read current and increased read pulse width. The comparative temperature value, and both the reduction in read current and increase in pulse width in an embodiment occur at the memory device level. The method includes in an aspect obtaining a comparative temperature value for the plurality of memory cells includes obtaining at least one of the group consisting of obtaining a temperature measurement of at least one of the plurality of memory cells to be read; obtaining a temperature measurement of the memory device that contains the plurality of memory cells to be read; and using the read frequency of at least one of the plurality of memory cells to be read or the memory device containing the plurality of memory cells to be read.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

The various aspects, features and embodiments of the memory devices or systems, their architectural structure, and method of operation will be better understood when read in conjunction with the figures provided. Embodiments are provided in the figures for the purpose of illustrating aspects, features and/or various embodiments of the memory devices and system, their architectural structure, and method of operation, but the claims should not be limited to the precise arrangement, structures, features, aspects, embodiments or devices shown, and the arrangements, structures, subassemblies, features, aspects, embodiments, methods, and devices shown may be used singularly or in combination with other arrangements, structures, subassemblies, features, aspects, embodiments, methods and devices.

DETAILED DESCRIPTION

The following description is made for illustrating the general principles of the invention and is not meant to limit the inventive concepts claimed herein. In the following detailed description, numerous details are set forth in order to provide an understanding of the memory devices and system, their architectural structure, and method of operation, however, it will be understood by those skilled in the art that different and numerous embodiments of the memory devices and system, their architectural structure, and method of operation may be practiced without those specific details, and the claims and invention should not be limited to the embodiments, subassemblies, features, processes, methods, aspects, features of details specifically described and shown herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an" and "the" include plural referents unless otherwise specified.

Memory systems and devices, their architecture, and/or methods of performing read/write operations in a memory system or subsystem are disclosed. In one embodiment, a memory system, architectural structure, and/or method of storing and/or fetching data in memory systems, including memory devices, is disclosed. The memory system as disclosed in more detail below may include one or more memory devices, and one or more data buffer circuits. The memory system may further include a memory control circuit, which may in one embodiment include a memory controller to control the flow of data going to and from the memory devices. There may be communication links or buses for transferring data, commands, responses, and/or signals between the Host, the memory devices, the data buffer circuits, and/or the memory control circuits.

A computer's memory subsystem often comprises memory modules, usually one or more dual in-line memory modules (DIMMs), which usually include a plurality of memory devices. Typically the memory devices are dynamic random access memory (DRAM) devices. Magnetic random access memory (MRAM) is different from DRAM, but offers many of the performance advantages of DRAM, while also offering the benefits of being a persistent type memory, e.g., non-volatile. Spin-Transfer Torque (STT) MRAM is a particular type of MRAM that offers higher speed, lower latency, scalability and high endurance. In one or more embodiments, a memory device and memory system, their architectural structure, and/or method of storing information is disclosed, including a method of improving the reliability of the memory devices and memory system, including the read reliability of the memory devices and memory system.

Figure 1:
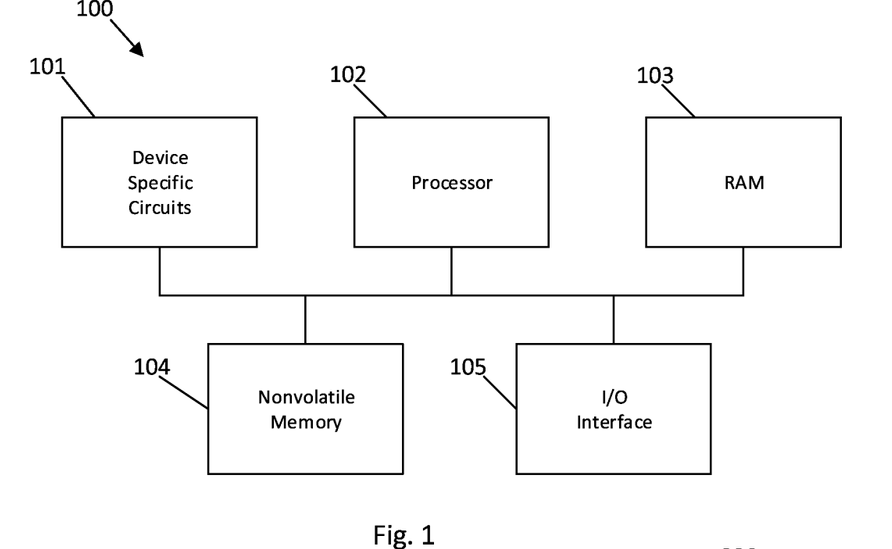
FIG. 1 depicts a general computing or data processing system in accordance with one embodiment.

A computing or data processing system 100 suitable for storing and/or executing program code may take many forms and in one embodiment may include at least one processor 102, which may be or be part of a controller, coupled directly or indirectly to memory devices or elements through a system bus, as shown in FIG. 1. Computing system 100 in FIG. 1 is shown with a processor 102, Random Access Memory (RAM) 103, long term memory 104, device specific circuits 101, and I/O interface 105. Alternatively, the RAM 103 and/or device specific circuits 101 and I/O interface 105 could be contained within the processor 102. The processor 102 may comprise, for example, an off-the-shelf microprocessor, custom processor, Field Programmable Gate Array (FPGA), Application Specific Integrated Circuit (ASIC), discrete logic, etc. The RAM 103 is typically used to hold variable data, stack data, executable instructions, etc., and may include Random Access Memory or RAM. In one or more embodiments the RAM 102 can contain magnetic random access memory (MRAM), and more specifically could use Spin Torque Transfer (STT) MRAM, and in an embodiment can contain the improved STT-MRAM memory devices disclosed herein.

According to various approaches, the long-term memory 104 typically comprises any type of nonvolatile memory such as, but not limited to, Electrically Erasable Programmable Read Only Memory (EEPROM), flash Programmable Read Only Memory (PROM), battery backup RAM, hard disk drives, etc. The long-term memory 104 is typically used to hold the executable firmware and any nonvolatile data containing programming instructions that can be executed to cause the processor 102 to perform certain functions.

In some embodiments, the I/O interface 105 may include a communication interface that allows the processor 102 to communicate with devices external to the controller. Examples of the communication interface may comprise, but are not limited to, serial interfaces such as RS-232, USB (Universal Serial Bus), Small Computer Systems Interface (SCSI), RS-422 or a wireless communication interface such as Wi-Fi, Bluetooth, near-field communication (NFC) or other wireless interfaces. The computing system 100 may communicate with an external device via the communication interface 105 in any communication protocol such as Automation/Drive Interface (ADI).

Figure 2:
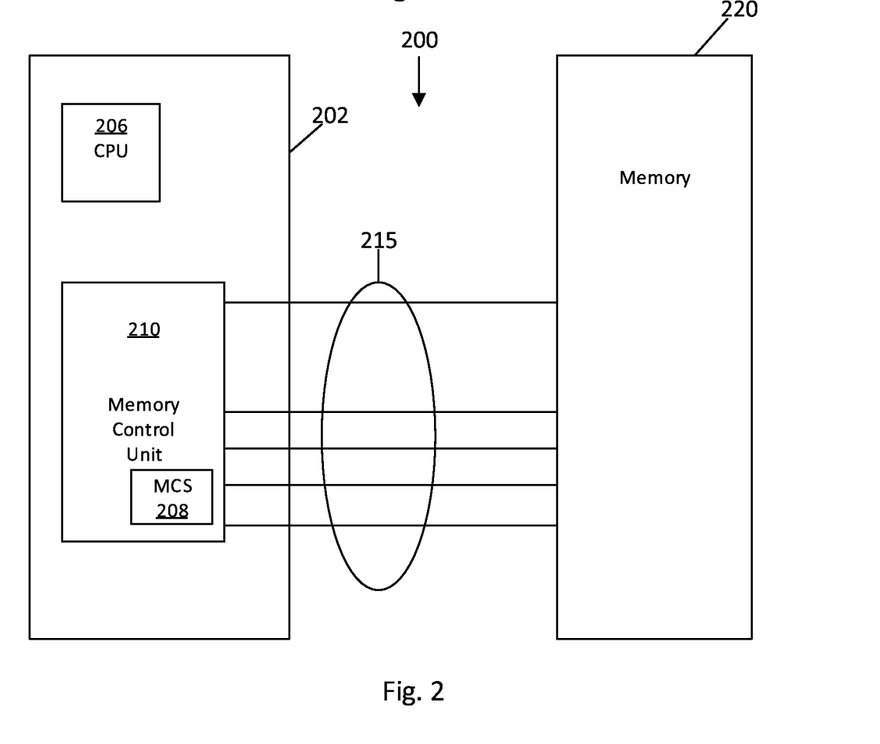
FIG. 2 depicts a memory subsystem in accordance with an embodiment.

FIG. 2 depicts an exemplary memory system 200 that may be part of a larger computer system structure or network. The computer system 200 includes a control processor system 202, which is a processing subsystem that includes at least one processor unit (CPU) 206 that can be configured to interface with a Memory Control Unit (MCU) 210. The processor or CPU 206 may be a module that processes read, write, and configuration requests from a system controller (not depicted). The processor 206 may be a multi-core processor. The MCU 210 may include a memory controller synchronous (MCS) 208, also referred to as a memory controller, that controls communication with one or more memory devices 250 (not shown in FIG. 1) in a memory subsystem 220. The MCU 210 and the MCS 208 may include one or more processing circuits, or processing may be performed by or in conjunction with the processor 206. The control processor system 202 communicates with the memory subsystem 220 through a communications bus 215. Control processor system 202, processor or CPU 206, memory control unit 210, and MCS 208, individually and collectively, may be referred to herein as the Host. The Host as used herein is used broadly to refer to a processor, controller or device that sends and receives command and/or control signals to a memory system or subsystem. The Host may also send and receive data signals from a memory system or subsystem.

Figure 3:
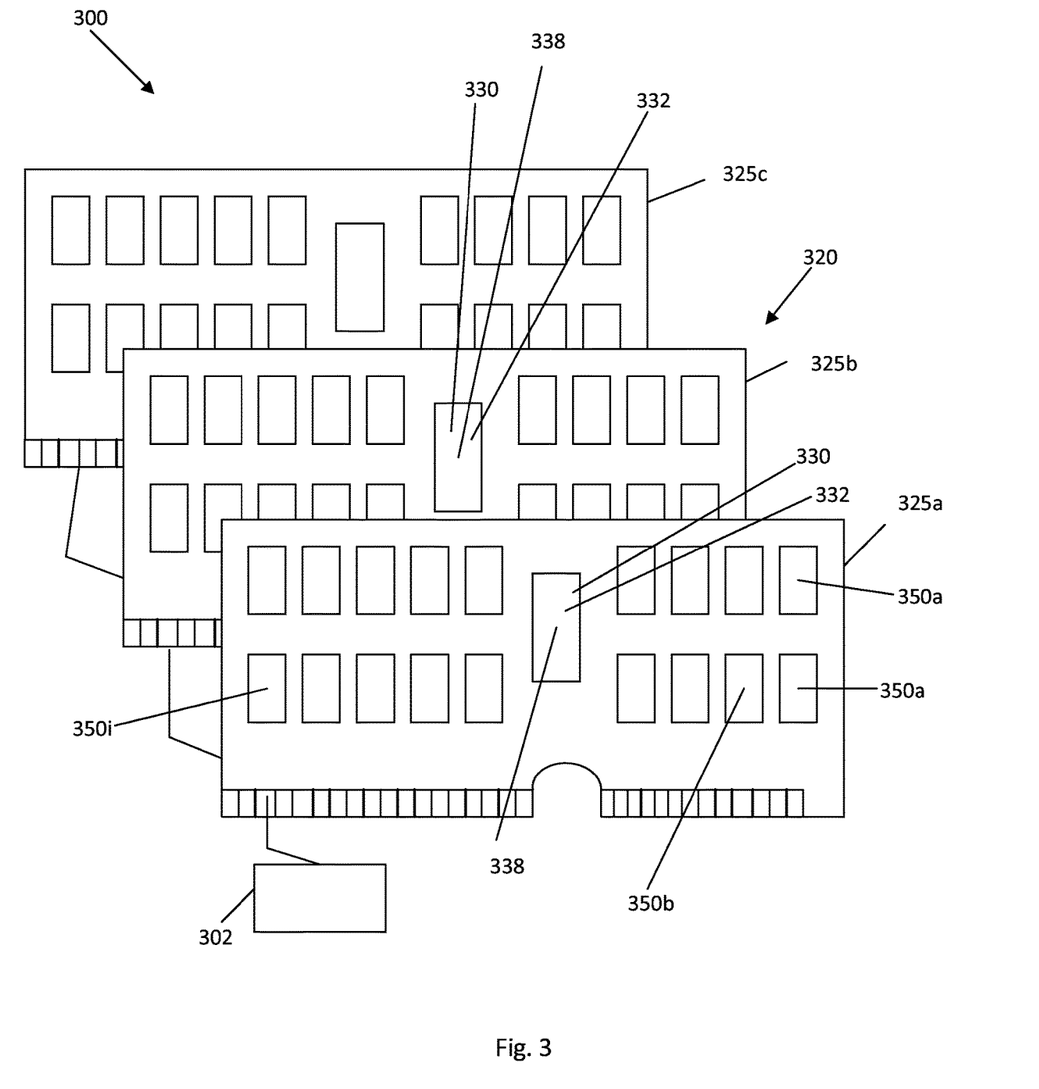
FIG. 3 depicts a memory subsystem including a DIMM configuration containing memory devices in accordance with an embodiment.

In the example of FIG. 3, a memory system 300 is illustrated having a memory control processor 302 and a memory subsystem 320. The memory or data storage subsystem 320 may be configured to store data and to provide storage services to one or more Hosts, which can be connected to the storage system 320 directly or through a network (e.g., over the internet). The memory subsystem 320 may include an interface for supporting communications with the Host.

Memory subsystem 320 comprises a plurality of memory modules, e.g., Dual Inline Memory Modules or DIMMs 325. While only three (3) DIMMs 325a-c are shown in FIG. 3, it will be appreciated that memory subsystem 320 can contain one or more DIMMs 325, including more than the three DIMMs shown in FIG. 3. The DIMMs 325 may be arranged in channels and ranks, with one or more DIMMs 325 per channel or rank. Each DIMM 325 may contain one or more memory devices 350, e.g., 350a-350i. The memory devices 350 may be integrated circuits or chips, which may also be referred to as memory chips 350. The memory chips 350 contain the basic memory cells that hold bits of information. The memory cells in a memory device, e.g., STT-MRAMs, are usually arranged in banks, where each bank is an array of rows and columns.

The memory subsystem 320 may also include one or more memory control circuits 330, in addition to the one or more memory devices 350. The memory control circuit 330 manages the flow of data going to and from the memory devices 350. The memory control circuit 330 typically receives signals such as command and control signals from a Host, e.g., a Host processor. The memory control circuit 330 in one embodiment may have a memory controller 332. The memory control circuit 330 or memory controller 332 may have a scheduler 338. The memory control circuit 330, memory controller 332, and/or scheduler 338 may optimize the order of operations and instructions. In one or more embodiments, as shown in FIG. 3, the memory control circuits 330 are formed as an integrated circuit or chip and are located on the module 325 with the memory devices 350. Other configurations are contemplated for the memory control circuit 330, memory module(s) 325, and for the memory subsystem 320. For example, the memory controller can be local to, and on the same chip as the processor.

While the memory devices 350 are shown in the form of chips on a DIMMs 325 it can be appreciated that the memory devices can take other forms and configurations and are not limited to be used on a DIMM. For example, the memory devices could form a solid state drive (SSD). One or more of the memory devices 350 in one or more embodiments are STT-MRAM devices. Magnetic random access memory (MRAM) is a form of RAM and could have application in information handling systems. STT-MRAM is a type of MRAM.

Figure 4:
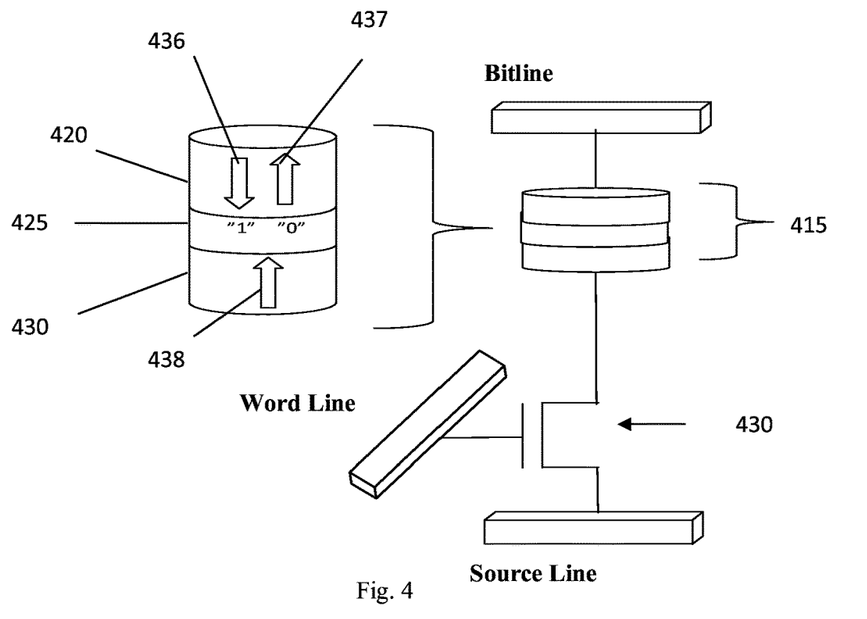
FIG. 4 diagrammatically depicts a Magnetic Tunnel Junction (MTJ) cell of a STT-MRAM memory device.
Figure 5:
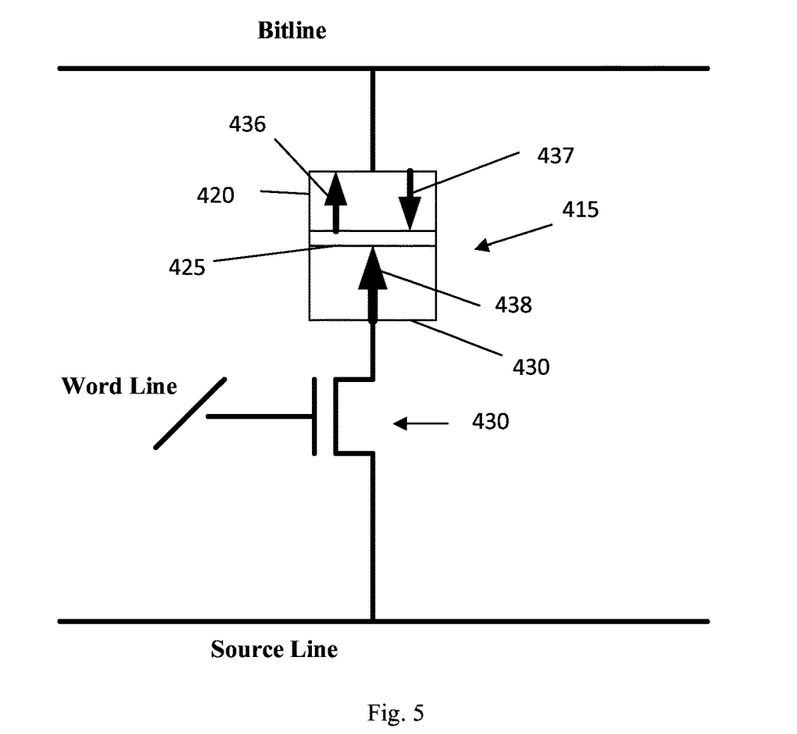
FIG. 5 diagrammatically illustrates the MTJ cell of FIG. 4.

A STT-MRAM cell uses a Magnetic Tunnel Junction (MTJ) 415 shown in FIGS. 4 and 5 to store binary data. The MTJ 415 has a free layer 420, a barrier layer 425 and a fixed or reference layer 430. When the magnetic field of the free layer 420 and the fixed/reference layer 430 are parallel as illustrated diagrammatically by arrows 436, 438, the MTJ resistance is low representing logical "0", and when the magnetic field of the free layer 420 and the fixed layer 430 are not parallel as illustrated diagrammatically by arrows 437, 438, the MTJ resistance is high representing a logical "1." Current is passed through the STT-MRAM to write the data, and the write current is set high enough to set, and if appropriate flip, the polarization of the free layer 420. Current is also passed through the STT-MRAM to read the data, and in an aspect the current is passed and resistance is measured to read the data in the memory cell. The STT-MRAM cells, e.g., the MTJ cells 415, are arranged in rows and columns and are addressed similar to DRAM technology. STT-MRAM utilizes an access transistor 435 as shown in FIG. 4, which in the example of FIG. 5 is a NMOS access transistor.

Even though STT-MRAM exhibits DRAM performance and persistency, and has endurance and persistence like non-volatile memory technology, STT-MRAM devices can have reliability issues. Thermal stability of the MTJ cell in a STT-MRAM chip is a key factor when considering reads to the cell, data retention at the cell, and also writes to the cell. Current is passed through the MTJ cell in an STT-MRAM device to read the data. The amount of current applied to the cell affects the ability to read the data in that cell. The higher the amount of current applied to the cell (within limits), the better the ability to "sense" or read the data in the cell. One measure of the ability to read the data in the cell is referred to as Read sense Bit Error Rate (BER). As the amount of current applied to the cell is increased to read the data, typically (within limits) the Read sense BER decreases. The current that passes through the MTJ cell to read the data in that cell, however, also has the ability to affect the data being in the cell. The read mode current is in either the same direction or the opposite direction as the write mode current. Even though the read current is set lower, in situations where it is opposite to the direction of the write current used to write the data to that cell, the read current could change the polarity of the cell. This disturbance of the data when passing a current for reading the cell is referred to as Read disturb Bit Rate Error (BER). Because the write mode current is set high enough it has a high probability of implementing the desired polarity flip in the free layer 420, while the read mode current has a lower probability of resulting in the undesired polarity flip in the free layer 420. The higher the amount of current used to read the data in a MTJ cell, the larger the probability of the bit flipping and the higher the Read disturb BER.

As indicated above, the thermal stability of the MTJ cell in a STT-MRAM device is a key consideration when considering data reads, data retention, and also data writes to the MTJ cell. As the temperature increases, the Tunneling Magnetic Resistance (TMR) in the MTJ cell is reduced, which in turn creates issues with the reliability of the STT-MRAM device. More specifically, as the temperature of the MTJ cell increases and the TMR reduces, it becomes more difficult to read the data in the MTJ cell decreases. That is, as the temperature of the MTJ cell increases, and the TMR of the cell is reduced, the ability to read the data in the MTJ cell decreases, and the Read disturb BER increases. As temperature increases in the STT-MRAM and the corresponding MTJ memory cells, and the TMR of the MTJ cells decrease, there is also an increase to the Read disturb BER. In addition, increasing the temperature of the MTJ cells in STT-MRAM devices also lowers the amount of time the cell retains the data, e.g., lowers the data retention time or endurance of the cell. As the temperature on the chip which includes the STT-MRAM devices and their array or stack of MTJ cells increases (which can vary by chip and the STT-MRAM devices), the temperature of each MTJ cell will be even higher. Thus, an increase in temperature will exacerbate the reliability issues with the STT-MRAM chip based memory subsystem.

This disclosure addresses the reliability issues with memory devices, including non-volatile memory devices such as, for example STT-MRAM, and more specifically addresses temperature related issues with STT-MRAM reading operations. The disclosure also proposes in an aspect a power conservation mode that can be applied to the memory devices. In one or more aspects, the disclosure proposes systems and methods to improve Bit Error Rates (BER) for STT-MRAM reading operations. In one or more embodiments, the disclosed system and method controls, manages, and/or adjusts read current to the MTJ memory cell, STT-MRAM device or devices, the DIMM which contains one or more of the STT-MRAM devices, and/or the memory subsystem containing one or more of the STT-MRAM devices when temperature increases, or when characteristics corresponding to temperature, for example, read frequency, increase. In one or more embodiments, the disclosed system and method controls, manages, and/or adjusts read current pulse width to the MTJ cell, STT-MRAM device or devices, the DIMM which contains one or more of the STT-MRAM devices, and/or the memory subsystem containing one or more of the STT-MRAM devices in response to temperature variations, or when characteristics corresponding to temperature, for example, read frequency, change. For example, the read current to the MTJ memory cell; the STT-MRAM device or devices; the DIMM, memory card, or other form (e.g., SDD) which contains one or more of the STT-MRAM devices; and/or the memory subsystem containing one or more of the STT-MRAM devices can be reduced in response to temperature, and the read current pulse width to the MTJ memory cell; the STT-MRAM device or devices; the DIMM, memory card, or other form (e.g., SDD) which contains one or more of the STT-MRAM devices; and/or the memory subsystem containing one or more of the STT-MRAM devices is increased in response to temperature. In an alternative example, the read current, the read pulse width, or both the read current and pulse width, is/are reduced in response to temperature, e.g., low temperatures, to conserve power.

In an aspect, the system and method detect or determine an increase in temperature (or a characteristic that corresponds to temperature, e.g., read frequency), and in response manages, including adjusts, the read current and/or the pulse width (duration) of the read current applied to the MTJ memory cell and/or STT-MRAM devices. More specifically, based upon the temperature of the MTJ cell, or more likely the temperature in the STT-MRAM chip, at the chip casing, or at a location that correlates with the temperature at the MTJ cell or array/stack, and in response to the temperature reaching a threshold, the read current can be decreased, and/or the read pulse width can be increased. Decreasing read current will decrease the Read disturb BER, can improve reliability, and can also conserve power. Lowering the read current, however, can also increase Read sense BER. Increasing the read pulse width can improve Read sense BER and can improve reliability.

As the temperature increases, the thermal stability of STT-MRAM decreases and the read disturb BER increases. Lowering the read current can improve read disturb BER, but decreasing read current can increase Read sense BER. Increasing the read pulse width can compensate for the decrease in Read sense caused by the decrease in read current, and keep Read sense BER at a tolerable level. Dynamically lowering the read current and/or increasing the read pulse width can be utilized to balance both Read sense BER and Read disturb BER in memory devices, including STT-MRAM devices.

It should be appreciated that the read current and/or read pulse width can be managed and adjusted depending upon the application or implementation at the MTJ memory cell level; at the STT-MRAM device level (which may include a layer or array of MTJ memory cells or a three-dimensional stack of MTJ memory layers/arrays); multiple STT-MRAM devices level; the DIMM, memory card, or other form (e.g., SDD) level containing multiple STT-MRAM devices; and/or the memory subsystem level containing multiple memory devices. Thus in instances the disclosure for explanatory purposes may refer to the memory cell or the memory device, but it should be recognized that the concepts and teaching have application beyond just the memory cell or memory device. Whether the reduction of read current or read pulse width is applied at the cell level, device level, devices(s) level, DIMM level, memory card level, other configuration (e.g., SDD) level, and/or memory subsystem level will be a matter of implementation and design choice.

In addition, it should be appreciated, that the temperature measurement, determination, and/or calculation upon which the adjustment in read current and/or read pulse width is based, can be based upon one or more criteria, including for example the temperature of the memory cell, the temperature of the memory array, stack or chip containing the memory cells, the temperature at the device or devices level, the temperature at the DIMM, memory card, or other form (e.g., SDD) level, and/or the temperature of the memory subsystem. Moreover, the criteria used to "determine" or "calculate" the temperature upon which adjustments to the read current and/or read pulse width would be implemented is not limited to temperature measurements. For example, memory read frequency rates could be utilized as an indication of the memory cell or memory device temperature. Power dissipation could be utilized as another criteria for determining memory cell or memory device temperature.

Turning to an example of an implementation of the methods disclosed, the major part of the logic can reside in the memory controller with the support of programmable read current flexibility at the STT-MRAM device. The logic could reside in other controllers, e.g., a storage controller. The memory controller in an embodiment is remote from the memory devices, e.g., the STT-MRAM array/chip, and can be part of the processor or a separate chip on the DIMM that contains the memory devices. In an aspect, the memory ACT command is split into a read command (ACT-RD) and a write command (ACT-WR). In one or more embodiments, the system measures the temperature of the MTJ cell, and/or the temperature of the chip, or a location, or a characteristic that correlates with the temperature at the MTJ cell(s). For example, the system could look at any characteristic that would correlate with temperature or would permit calculation of the temperature of the MTJ cell(s) or STT-MRAM device. In one or more embodiments, the system or method could be based upon read frequency, increases in read frequency, or read frequency beyond a certain threshold, and use that measurement as an indication of the temperature at the MTJ cell(s) or memory device. In an example, the Device Thermal Sensor (DTS) can be on each die to read the temperature. In an embodiment, a thermal sensor can be associated with the device/chip casing and measure temperature, and the system and method can be based upon the chip casing temperature measurements. Temperature sensors can also be on the memory card, DIMM, or other form (e.g., SDD) containing the memory devices. The MTJ cell, STT-MRAM device, or memory card/DIMM temperature, can be read through the serial (I2C) interface. The temperature data can be stored in the memory controller, for example in EEPROM. In the case of a three dimensional chip employing stacks of MJT arrays, the temperature information can be stored in the logic area/layers of the 3D-stack chip.

Each implementation preferably would be specific to the design of the STT-MRAM devices, DIMMs, SSD, memory card, and/or memory subsystem. The logic in an embodiment resides as part of the memory controller and is supported by the STT-MRAM devices, DIMMs, and/or memory subsystem. The STT-MRAM devices would need to support an adjustable, or programmable, read current circuit. The memory controller architecture would need to support the feature of adjusting read current and/or adjusting the read pulse width. The memory controller in one or more embodiments would adjust the read current and/or the pulse width. The timing should also be supported by the memory controller, e.g., by the memory controller sequencer. The memory controller will apply the short or long pulse width as part of the sequencer in the memory controller. In one or more embodiments, if the STT-MRAM device is used as a discrete component, not as a rank of several chips, then the read current can be modified at the STT-MRAM chip level using Memory Register set command methods supported by traditional memory devices.

In one or more embodiments, by lowering the regular read current from 20 uA to 16 uA, the Read disturb BER was lowered significantly. Of course, this example of lowering the read current is just an embodiment, and different read current values and reductions in read current, are contemplated. In the above example, the read current was decreased about 20%, and decreases less than and greater than 20% are contemplated, including decreases of, for example, 10%, 25%, 30%, or other values. The amount of read current reduction will depend upon a number of factors including the STT-MRAM device design, the operating environment, and the desired performance, included Bit Error Rates. Increasing the read pulse width has shown a reliability increase of 2 to 5 times in elevated temperature situations. In one or more aspects, the pulse width was increased from about 26 nSec. to about 32 nSec. (or roughly a 20-25% increase). The use of other read pulse widths, and increases/decreases in pulse width, are contemplated and the example should not be considered limiting. For example, the pulse width can be increased 10%, 15%, 20%, 25%, 30%, or other amounts (lower or higher), over the normal read pulse width. The amount of read current pulse width increase or enlargement will depend upon a number of factors including the STT-MRAM device design, the operating environment, and the desired performance, included Bit Error Rates. Lowering the read current and/or increasing the read pulse width can be varied and balanced to obtain the desired performance characteristics; including Read sense BER and Read disturb BER.

In addition, implementing these features in memory systems, including systems employing STT-MRAM devices, improves the system performance as less time is spent on error detection and correction. Accordingly, reducing current to MRAM devices in response to temperature characteristics in the MTJ cell and/or MRAM devices improves overall reliability of the MRAM based memory subsystem without sacrificing acceptable Read sense and Read disturb BER levels. By decreasing read current and/or increasing pulse width, overall system performance can be maintained, or system performance degradation can be minimized in response to elevated temperatures in the MRAM devices. Implementing one or more of the disclosed features of reduced read current and/or increased read pulse width, in response to elevated temperatures can also save memory power requirements. In an embodiment, both the read current and the read pulse width can be reduced, for example, in response to low temperatures (e.g., below a temperature threshold) to reduce power consumption. The energy conservation can be at the Bank or Rank level by varying the read pulse width based upon the thermal profile of the planar or stacked (three-dimensional) STT-MRAM devices in a DIMM.

Figure 6:
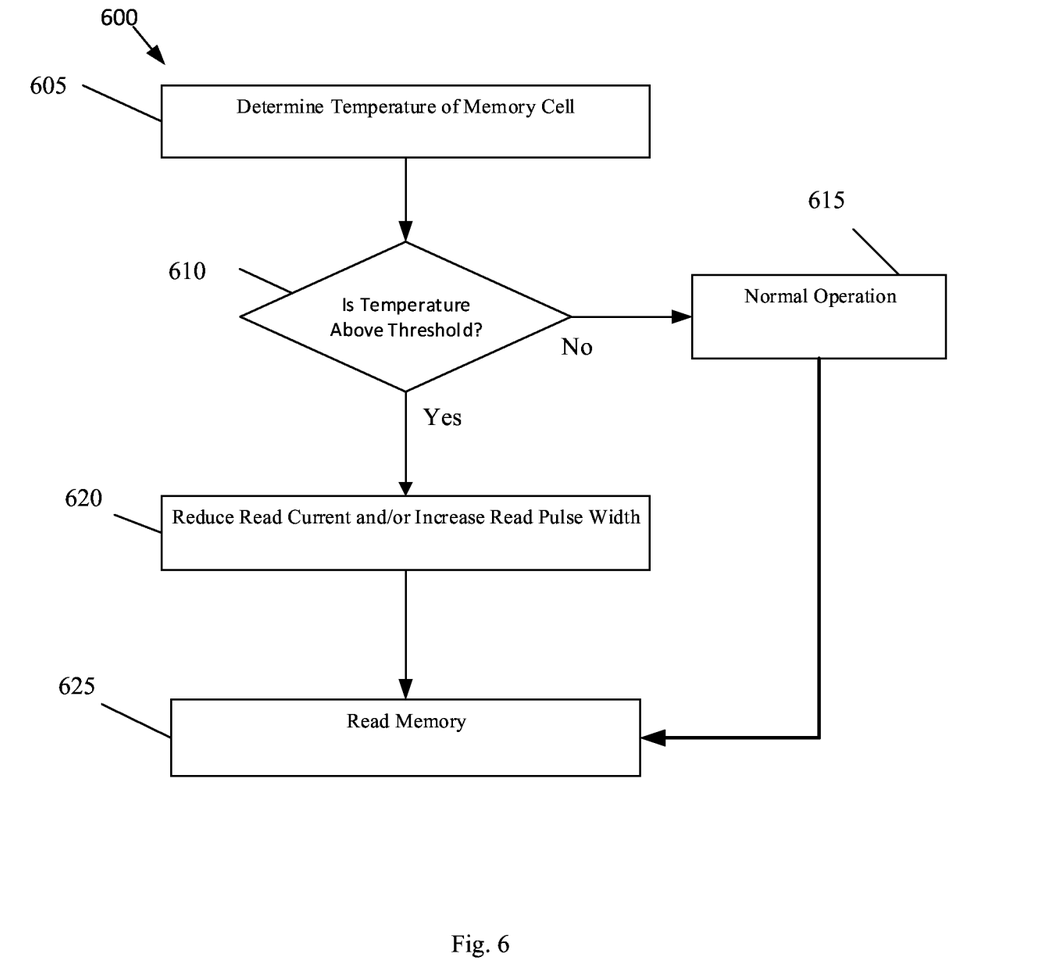
FIG. 6 depicts a flow diagram of a method of performing a read operation in accordance with an embodiment.

FIG. 6 is an exemplary flowchart in accordance with one embodiment illustrating and describing a method of reading data in a memory system, including reading data in a STT-MRAM device or memory subsystem having a plurality of STT-MRAM devices, in accordance with an embodiment of the present disclosure. While the reading method 600 is described for the sake of convenience and not with an intent of limiting the disclosure as comprising a series and/or a number of steps, it is to be understood that the process does not need to be performed as a series of steps and/or the steps do not need to be performed in the order shown and described with respect to FIG. 6, but the process may be integrated and/or one or more steps may be performed together, simultaneously, or the steps may be performed in the order disclosed or in an alternate order.

At 605, in response to a request to read data from memory, e.g., from one or more memory cells and/or memory devices, the system determines (or calculates) the temperature of the memory cell, and in an embodiment determines the temperature of the MTJ cell in one or more STT-MRAM devices. The system can use one or more techniques to determine the temperature of the memory cell, e.g., the MTJ memory cell. In an embodiment, the system can measure the temperature of the MTJ cell.

More likely, the system will determine the temperature of the STT-MRAM device or chip, the casing of the STT-MRAM device, or the temperature of the DIMM. For example, the system can read the DTS sensor inside the memory device array, e.g., the stacked dies forming the memory device. With the temperature data of, for example, the STT-MRAM device, or DIMM (or other form of holding the STT-MRAM devices), the temperature at the MTJ cell can be calculated. The system can also calculate the temperature at the MTJ cell by using other data that correlates with the temperature at the MTJ cell. In an embodiment, the system and method can use the read frequency, e.g., read the number of read commands in a 512 clock window. In another embodiment, the MTJ cell temperature can be calculated by using the ambient temperature and using the power dissipation of the STT-MRAM devices (and/or other devices). The system can also determine the temperature without per se performing any calculations, but can instead use data that is correlated to the temperature at the MTJ cell. For example, the system can receive temperature data from the memory device DTS, and use that data directly for example in a look-up table.

At 610, it is determined whether or not the temperature of the memory cell and/or memory device, e.g. the STJ cell or STT-MRAM device (array/stack), is above a threshold temperature. At 610 the system, e.g., the memory controller, in an embodiment, compares the temperature of the memory cell and/or memory device determined at 605 against one or more threshold values. The threshold values can vary depending upon a number of factors including the desired memory performance, Read sense BER, Read disturb BER, and other factors. The threshold value will generally depend upon the design of the memory system, including the design of the MTJ memory cells, array, and/or stack; the design of the STT-MRAM arrays/devices; and the design of the DIMMs or other form of arranging the STT-MRAM arrays/devices. The threshold can be predetermined, programmable, and/or dynamic.

If at 610, the temperature, e.g., the determined temperature, of the memory cell and/or memory device is not above the threshold temperature (610: No), then at 615 the system performs the read operation under normal conditions, e.g. normal current value and pulse width. If, however, the temperature of the memory cell and/or memory device at 610 is above the threshold temperature (610: Yes), then the method 600 proceeds to 620 where the read current is reduced and/or the read pulse width (read current duration) is increased. More specifically, in response to the temperature of the memory cell and/or memory device exceeding the threshold temperature, the system in one or more embodiments reduces the read current applied to the memory cell and/or memory device. The reduction in current can be at the memory cell level (e.g., MTJ cell), the memory device level (e.g., STT-MRAM device), the DIMM level, the group level, or the memory subsystem rank level, or other level of arranging the STT-MRAM memory cells. In an embodiment, the read current applied to the memory cell and/or memory device, e.g., the STT-MRAM device, during a read operation can be reduced by ten percent (10%). Alternatively, in response to the temperature of the memory cell and/or memory device exceeding the threshold temperature, the system in one or more embodiments, increases the read pulse width (in an aspect, to compensate for the drop in read current). The increase in read pulse width can be at the memory cell level (e.g., MTJ cell), the memory device level (e.g., STT-MRAM device), the DIMM level, or the memory subsystem rank level. For example, the read pulse width applied to the memory cell and/or memory device, e.g., the STT-MRAM device, during a read operation can be increased by ten percent (10%). Preferably, in one or more embodiments, both the read current can be reduced and the read pulse width can be increased in response to temperature of the memory cell and/or memory device exceeding the temperature threshold. In an example, the read current is reduced twenty percent (20%) and the read pulse width is increased twenty percent (20%). The preceding values are exemplary only and are not to be considered limiting.

At 625 the memory cell is read. In response to the next read request from memory, the process 600 of FIG. 6 can be repeated. In a dynamic situation, one or more of the temperature threshold, the amount the read current is decreased, or the amount the read pulse width is increased, can be changed. The threshold and parameters for read current reduction and read pulse width enlargement can be programmable, and based upon various operating conditions, environments or other factors, the threshold and parameters can change.

Figure 7:
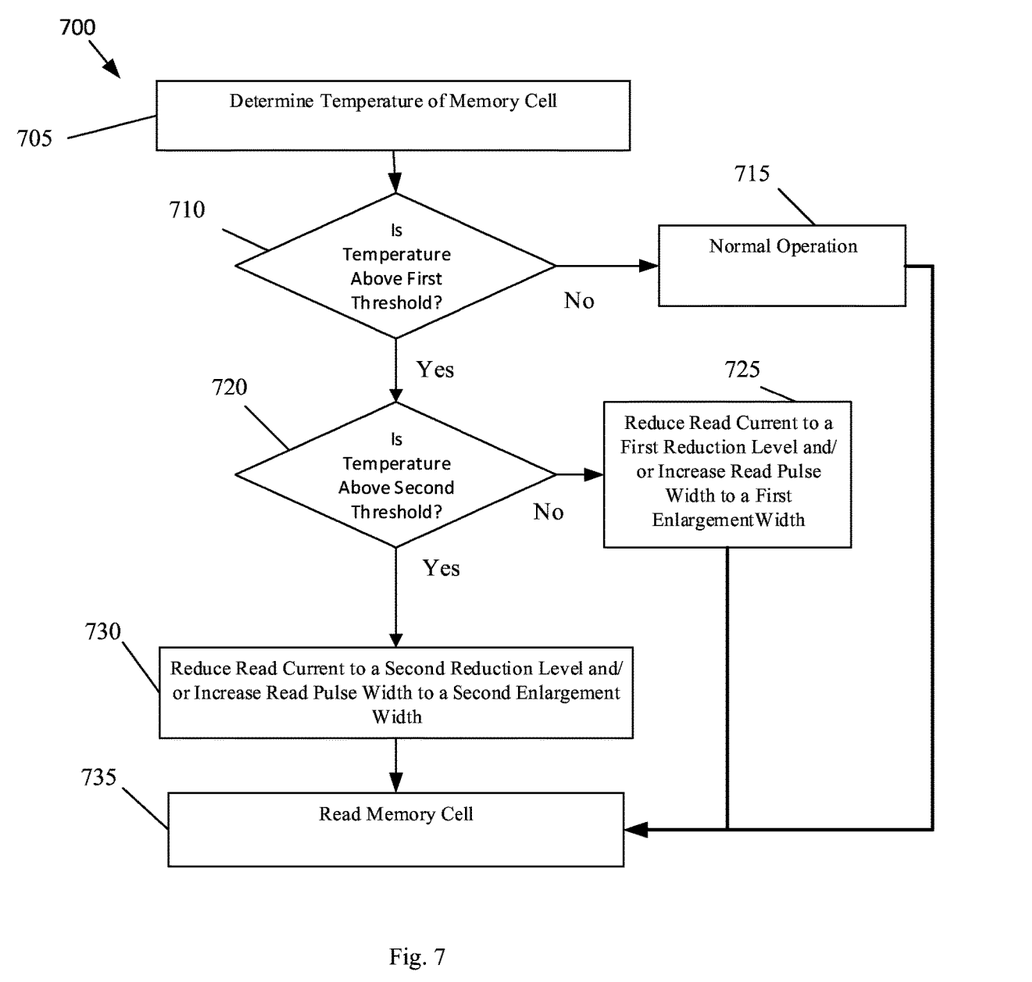
FIG. 7 depicts a flow diagram of a method of performing a read operation in accordance with another embodiment.

FIG. 7 illustrates another exemplary flowchart in accordance with an embodiment illustrating and describing a method of reading data in a memory system, including reading data in a STT-MRAM device or a memory system having a plurality of STT-MRAM devices, in accordance with an embodiment of the present disclosure. While the reading method 700 is described for the sake of convenience and not with an intent of limiting the disclosure as comprising a series and/or a number of steps, it is to be understood that the process does not need to be performed as a series of steps and/or the steps do not need to be performed in the order shown and described with respect to FIG. 7, but the process may be integrated and/or one or more steps may be performed together, simultaneously, or the steps may be performed in the order disclosed or in an alternate order.

The method 700 is similar to the method 600 of FIG. 6, but instead uses more than one temperature threshold during the memory reading process. It should be appreciated that more than two thresholds can be used in the memory read process 700. At 705, in response to a request to read data from memory, the temperature of the memory cell and/or memory device can be determined. The process and methods for determining the temperature can be the same as those discussed in connection with 605 in FIG. 6, and elsewhere in this disclosure.

At 710, it is determined whether or not the temperature of the memory cell and/or memory device, e.g., the MTJ cell and/or STT-MRAM device, is above a first temperature threshold. At 710 the system, e.g., the memory controller, in an embodiment compares the temperature of the memory cell and/or memory device determined at 705 against a first threshold value. The first threshold value can vary depending upon a number of factors including the desired memory performance, Read sense BER, Read disturb BER, and other factors. The first threshold value will generally depend upon the design of the memory system, including the design of the MTJ memory cells, array, or stack; the design of the STT-MRAM arrays/devices; and the design of the DIMMs. The threshold can be predetermined, programmable, and/or dynamic.

If at 710, the temperature, e.g., the determined temperature, of the memory cell and/or memory device is not above the first threshold temperature (710: No), then at 715 the system performs the read operation under normal conditions, e.g. normal current value and pulse width. If, however, the temperature of the memory cell and/or memory devices at 710 is above the threshold temperature (710: Yes), then the method 700 proceeds to 720.

At 720, it is determined whether or not the temperature of the memory cell and/or memory devices is above a second threshold. At 720 the system, e.g., the memory controller, in an embodiment, compares the temperature of the memory cell and/or memory devices determined at 705 against a second threshold value. The first threshold value can vary depending upon a number of factors including the desired memory performance, Read sense BER, Read disturb BER, and other factors. The first threshold value will generally depend upon the design of the memory system, including the design of the MTJ memory cells, array and/or stack; the design of the STT-MRAM arrays/devices; and the design of the memory cards, DIMMs, or other forms of arranging the STT-MRAM arrays/devices. The threshold can be predetermined, programmable, and/or dynamic.

If at 720, the temperature, e.g., the determined temperature, of the memory cell and/or memory device is above the first threshold but not above the second threshold temperature (720: No), then at 725, the read current is reduced to a first reduction level and/or the read pulse width is increased to a first enlargement width. More specifically, in response to the temperature of the memory cell and/or memory device exceeding the second threshold temperature, the system in one or more embodiments reduces the read current applied to the memory cell to a first level (first reduction level). The reduction in current can be at the memory cell level (e.g., MTJ cell), the memory device level (e.g., STT-MRAM device), the DIMM level, memory card level, the memory subsystem rank level, or any other level or form of arranging the memory devices. In an embodiment, the read current applied to the memory cell and/or memory device, e.g., the MTJ cell or STT-MRAM device, during a read operation can be reduced by ten percent (10%). Alternatively, in response to the temperature of the memory cell and/or memory device exceeding the first threshold temperature, but does not exceed the second temperature threshold, the system in one or more embodiments increases the read pulse width to a first enlargement width. The increase in read pulse width can be at the memory cell level (e.g., MTJ cell), the memory device level (e.g., STT-MRAM device), the DIMM level, the memory card level, the memory subsystem rank level, or any other level or form of arranging the memory devices. For example, the read pulse width applied to the memory cell and/or memory device, e.g., the MTJ cell or STT-MRAM device, during a read operation can be increased by ten percent (10%). Preferably, in one or more embodiments, both the read current can be reduced and the read pulse width can be increased in response to temperature of the memory cell and/or memory device exceeding the first temperature threshold, but not exceeding the second temperature threshold. In an example, the read current is reduced ten percent (10%) and the read pulse width is increased ten percent (10%). The preceding values are exemplary only and are not to be considered limiting.

If at 720, the temperature, e.g., the determined temperature, of the memory cell and/or memory device is above the second threshold temperature (720: Yes), then at 730, the read current is reduced to a second reduction level and/or the read pulse width is increased to a second enlargement width. More specifically, in response to the temperature of the memory cell and/or memory device exceeding the second threshold temperature, the system in one or more embodiments reduces the read current applied to the memory cell and/or memory device to a second level (second reduction level). The reduction in current can be at the memory cell level (e.g., MTJ cell), the memory device level (e.g., STT-MRAM device), the DIMM level, the memory card level, the memory subsystem rank level, or any other level or form of arranging the memory devices. In an embodiment, the read current applied to the memory cell and/or memory device, e.g., the MTJ cell or STT-MRAM device, during a read operation can be reduced by twenty percent (20%). Alternatively, in response to the temperature of the memory cell and/or memory device exceeding the second threshold temperature, the system in one or more embodiments increases the read pulse width to a second enlargement width. The increase in read pulse width can be at the memory cell level (e.g., MTJ cell), the memory device level (e.g., STT-MRAM device), the DIMM level, the memory card level, the memory subsystem rank level, or any other level or form of arranging the memory devices. For example, the read pulse width applied to the memory cell and/or memory device, e.g., the MTJ cell or STT-MRAM device, during a read operation can be increased by twenty percent (20%). Preferably, in one or more embodiments, both the read current can be reduced and the read pulse width can be increased in response to temperature of the memory cell exceeding the second temperature threshold. In an example, the read current applied to the memory cell and/or memory device, e.g., the MTJ cell or STT-MRAM device, during a read operation is reduced twenty percent (20%) and the read pulse width is increased twenty percent (20%). The preceding values are exemplary only and are not to be considered limiting.

At 735 the memory cell and/or memory device is read applying the read current at the second reduction level and/or applying the read current for a pulse width duration set at the second enlargement level depending upon the programming as indicated by 730. In response to the next read request from memory, the process 700 of FIG. 7 can be repeated, or the system could apply the process 600 of FIG. 6, or a different process. In a dynamic situation, one or more of the temperature thresholds, the amount the read current is decreased, or the amount the read pulse width is increased can be changed for the different threshold levels. The threshold levels and parameters for read current reduction(s) and read pulse width enlargement(s) can be programmable, and based upon various operating conditions, environments or other factors, the threshold and parameters can change. For example, in an embodiment, the temperature threshold levels can remain the same, but the amount that the read current is reduced, and/or the amount that the pulse width is increased can change on the next memory read operation.

Figure 8:
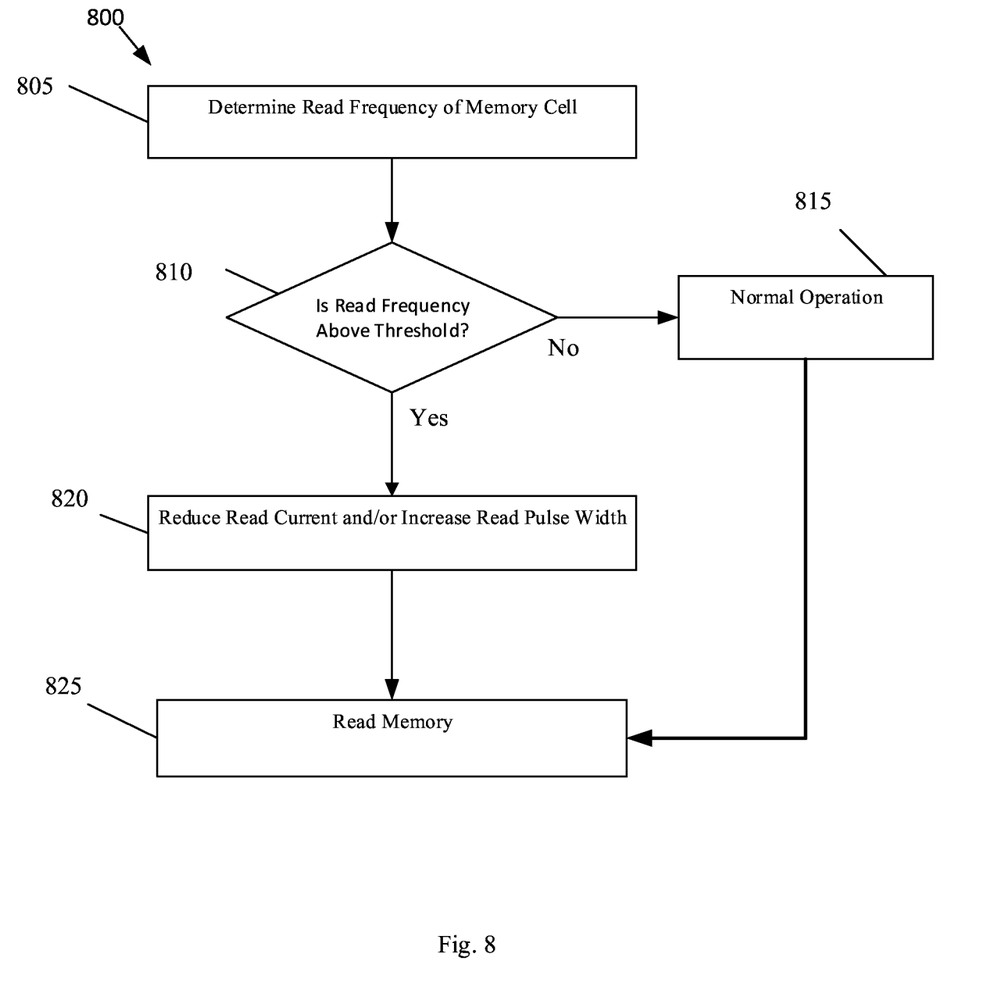
FIG. 8 depicts a flow diagram of a method of performing a read operation in accordance with yet a further embodiment.

FIG. 8 is an exemplary flowchart in accordance with an embodiment illustrating and describing a method of reading data in a memory system, including reading data in a STT-MRAM device or memory subsystem having a plurality of STT-MRAM devices, in accordance with an embodiment of the present disclosure. While the reading method 800 is described for the sake of convenience and not with an intent of limiting the disclosure as comprising a series and/or a number of steps, it is to be understood that the process does not need to be performed as a series of steps and/or the steps do not need to be performed in the order shown and described with respect to FIG. 8, but the process may be integrated and/or one or more steps may be performed together, simultaneously, or the steps may be performed in the order disclosed or in an alternate order.

At 805, in response to a request to read data from memory, e.g., from one or more memory cells and/or memory devices, the system determines (or calculates) the read frequency, e.g., the number of memory accesses that have recently been handled by the system. In this regard the system and method can use the read frequency, e.g., read the number of read commands in a 512 clock window. The read frequency, in an example, is an indication of the temperature at the memory cell and/or memory devices, e.g., the MTJ cell and/or STT-MRAM device. That is, in an embodiment, there would be a correlation between the frequency of read operations and the temperature of the memory cell, the memory device/chip, and/or the memory devices on, for example, a DIMM.

At 810, it is determined whether or not the read frequency of the memory cell and/or memory device, e.g. the STJ in an STT-MRAM, or of the STT-MRAM array/device/DIMM/card, is above a threshold read frequency. At 810 the system, e.g., the memory controller, in an embodiment compares the read frequency of the memory cell/device determined at 805 against one or more threshold values, and in an embodiment a first threshold. The threshold values can vary depending upon a number of factors including the desired memory performance, Read sense BER, Read disturb BER, and other factors. The threshold value will generally depend upon the design of the memory system, including the design of the MTJ memory cells, the design of the STT-MRAM arrays/devices, and the design of the DIMMs. The threshold can be predetermined, programmable, and/or dynamic.

If at 810, the read frequency of the memory cell/device (DIMM) is not above the threshold read frequency (810: No), then at 815 the system performs the read operation under normal conditions, e.g. normal current value and pulse width. If, however, the read frequency of the memory cell, memory device, memory card, or DIMM (multiple memory devices) at 810 is above the threshold read frequency (810: Yes), then the method 800 proceeds to 820 where the read current is reduced and/or the read pulse width (read current duration) is increased. More specifically, in response to the threshold being exceeded, which in an embodiment is indicative of the temperature of the memory cell and/or memory device exceeding a threshold temperature, the system in one or more embodiments reduces the read current applied to the memory cell and/or memory devices. The reduction in current can be at the memory cell level (e.g., MTJ cell), the memory device level (e.g., STT-MRAM device), the DIMM level, the memory card level, the memory subsystem rank level, or any other level or form of arranging the memory devices. In an embodiment, the read current applied to the memory cell and/or memory device, e.g., the MTJ cell and/or STT-MRAM device, during a read operation can be reduced by ten percent (10%). Alternatively, the system in one or more embodiments, in response to the read frequency of the memory cell, memory device, or DIMM exceeding the threshold read frequency, increases the read pulse width. The increase in read pulse width can be at the memory cell level (e.g., MTJ cell), the memory device level (e.g., STT-MRAM Device), the DIMM level, the memory card level, the memory subsystem rank level, or any other level or form of arranging the memory devices. For example, the read pulse width applied to the memory cell and/or memory device, e.g., the MTJ cell and/or STT-MRAM device, during a read operation can be increased by ten percent (10%). Preferably, in one or more embodiments, both the read current can be reduced and the read pulse width can be increased in response to read frequency of the memory cell, memory device, DIMM, memory card, or other arrangement of memory devices exceeding the read frequency threshold. In an example, the read current is reduced ten percent (10%) and the read pulse width is increased ten percent (10%). The preceding values are exemplary only and are not to be considered limiting.

Following 820, at 825 the memory cell and/or memory device is read. In response to the next read request from memory, the process 800 of FIG. 8 can be repeated. In a dynamic situation, one or more of the read frequency threshold, the amount the read current is decreased, or the amount the read pulse width is increased, can be changed. The threshold and parameters for read current reduction and read pulse width enlargement can be programmable, and based upon various operating conditions, environments or other factors, the threshold and parameters can change.

In an aspect, the system and method receives data indicative of the temperature at the memory cell, e.g., the MTJ cell, and/or memory devices, e.g., STT-MRAM devices, and the memory controller will look at a temperature look-up table for different devices and ranks and apply the reduced read current, the increased read pulse width, or both. The memory controller and the logic associated with implementing the methods can be on the processor chip or a separate chip, and in an embodiment can be located on the DIMM, memory card, or other arrangement that contains the memory devices, e.g., the STT-MRAM stacks/chips.

In one or more embodiments, a memory system and/or method for storing data is disclosed that conserves power. In an embodiment, the memory system includes at least one memory device having one or more memory cells for storing data; and a memory control circuit that manages the read current and read pulse width applied to the at least one memory device to read data stored in the at least one memory device. The one or more memory devices have a read current circuit configured to utilize adjustments to at least one of the read current and/or the read pulse width applied to the one or more memory cells within the one or more memory devices. In an embodiment, in response to a request to read a group of the memory cells, the memory control circuit in response to determining that a comparative temperature value is less than a first threshold, is configured to perform at least one of reducing the read current and/or decreasing the read pulse width to be applied to the plurality of memory devices to be read. In a further aspect, if the comparative temperature is greater than the first threshold temperature, the memory control circuit in response is configured to set to apply a normal read current and a normal read pulse width to the one or more memory cells within the one or more memory devices. In yet a further aspect, the memory control circuit is configured, in response to determining that a comparative temperature value is greater than a second threshold that is higher than the first threshold, to perform at least one of reducing the read current and/or increasing the read pulse width to be applied to the plurality of memory devices to be read.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory system for storing data, the memory system comprising:
   at least one memory device having one or more memory cells for storing data; and a memory control circuit that manages the read current and read pulse width applied to the at least one memory device to read data stored in the at least one memory device, wherein the at least one memory device has a read current circuit configured to utilize adjustments to at least one of the read current or the read pulse width applied to the one or more memory cells within the at least one memory device, and wherein, in response to a request to read a plurality of the memory cells, the memory control circuit is configured to:

determine a comparative temperature value based upon the read frequency of the at least one memory device containing the plurality of memory cells to be read; and     perform, in response to determining that the comparative temperature value exceeds a first threshold, at least one of reducing the read current to be applied to the at least one memory device or increasing the read pulse width to be applied to the plurality of memory cells to be read.

2. The system of claim 1, wherein determining the comparative temperature value comprises taking a temperature measurement of at least one of the plurality of memory cells to be read or taking a temperature measurement of the at least one memory device containing the plurality of memory cells to be read, and using a look-up table to obtain the comparative temperature value.

3. The system of claim 1, wherein determining whether a comparative temperature value exceeds a first threshold comprises comparing in the memory controller the comparative temperature value to the first threshold.

4. The system of claim 1, wherein the system further comprises a thermal sensor, and determining the comparative temperature value utilizes measurements from the thermal sensor.

5. The system of claim 1, wherein determining the comparative temperature value is based upon the temperature of at least one of the memory cells to be read or the temperature of the at least one memory device containing the plurality of memory cells to be read.

6. The system of claim 1, wherein the first threshold is programmable.

7. The system of claim 1, wherein in response to the comparative temperature value exceeding the first threshold, the memory control circuit is configured to both reduce the read current and increase the read pulse width applied to the at least one memory device containing the plurality of memory cells to be read.

8. The system of claim 1, wherein the read current is reduced between about ten percent (10%) and about twenty five percent (25%), and the read pulse width is reduced between about ten percent (10%) and about twenty-five percent (25%).

9. The system of claim 1, wherein the memory control circuit is contained on a chip separate from the at least one memory device.

10. The system of claim 1, wherein the at least one memory device comprises an array of STT-MRAM cells.

11. The system of claim 1, wherein the memory control circuit is configured to:

in response to determining that the temperature comparative value exceeds a first threshold, perform at least one of reducing the read current applied to the at least one memory device to a first read reduction level or increasing the read pulse width applied to the at least one memory device to a first pulse width enlargement level; and     in response to determining that the temperature comparative value exceeds a second threshold, perform at least one of reducing the read current applied to the at least one memory device to a second read reduction level or increasing the read pulse width applied to the at least one memory device to a second pulse width enlargement level.

12. The system of claim 1, wherein the memory control circuit is configured to:

in response to determining that the temperature comparative value does not exceed a first threshold, reduce the read current applied to the at least one memory device to a first read reduction level and reduce the read pulse width applied to the at least one memory device to a first pulse width reduction level to conserve power;

in response to determining that the temperature comparative value exceeds the first threshold, apply read current to the at least one memory device at a normal level and apply read pulse width to the at least one memory device at a normal level; and     in response to determining that the temperature comparative value exceeds a second threshold higher than the first threshold, perform at least one of reducing the read current applied to the at least one memory device to a second read reduction level or increasing the pulse width to a first pulse width enlargement level.

13. The system of claim 1, further comprising a plurality of the memory devices arranged as a solid state drive.

14. A memory system for storing data, the system comprising:

at least one Spin-Transfer Torque—magnetic random access memory (STT-MRAM) device having a plurality of memory cells for storing data, the at least one STT-MRAM device has a read current circuit configured to read the plurality of memory cells using more than one read current and more than one read pulse width; and     a memory control circuit that manages the read current and read pulse width to be applied to the at least one STT-MRAM device to read data stored in the at least one STT-MRAM device,     wherein, the memory control circuit has a computer readable storage medium comprising program instructions that when executed by the memory control circuit causes the memory control circuit, in response to a request to read data from a group of the plurality of memory cells, to:

obtain a comparative temperature value for the group of memory cells, wherein obtaining a comparative temperature comprises determining the comparative temperature based upon the read frequency of the at least one memory device containing the plurality of memory cells to be read;

determine whether the comparative temperature value is above a first threshold value; and     in response to determining that the comparative temperature value is above the first threshold value, reduce the read current and increase the read pulse width to be applied to the group of memory cells to be read, and wherein the STT-MRAM device has a computer readable storage medium comprising program instructions that causes the STT-MRAM device to read the group of memory cells by applying the reduced read current and increased read pulse width to the group of memory cells.

15. The memory system of claim 14, wherein memory control circuit further comprises program instructions that when executed by the memory control circuit causes the memory control circuit to obtain the comparative temperature value for the group of memory cells by obtaining a temperature measurement for at least one of the group of memory cells or the at least one STT-MRAM device containing the group of memory cells, and perform a look-up in a look-up table for the comparative temperature value corresponding to the temperature measurement.

16. A method for reading data stored in a plurality of memory cells contained in a memory device, the method comprising:
    obtaining a comparative temperature value for the plurality of memory cells, wherein obtaining the comparative temperature value for the plurality of memory cells comprises determining the comparative temperature based upon the read frequency of the at least one memory device containing the plurality of memory cells to be read;
    determining whether the comparative temperature value is above a first threshold value;
    in response to determining whether the comparative temperature value is above the first threshold value, performing at least one of reducing the read current or increasing the read pulse width to be applied to the plurality of memory cells; and
    reading the plurality of memory cells by applying at least one of the reduced read current or increased read pulse width to the plurality of memory cells.

17. The method of claim 16, further comprising, in response to determining that the comparative temperature value is above the first threshold value, reducing the read current and increasing the read pulse width to be applied to the plurality of memory cells; and reading the plurality of memory cells by applying the reduced read current and increased read pulse width, and wherein the comparative temperature value, and both the reduction in read current and increase in pulse width occur at the memory device level.

18. The method of claim 16, wherein obtaining a comparative temperature value for the plurality of memory cells includes obtaining at least one of the group consisting of obtaining a temperature measurement of at least one of the plurality of memory cells to be read; obtaining a temperature measurement of the memory device that contains the plurality of memory cells to be read; and using the read frequency of at least one of the plurality of memory cells to be read or the memory device containing the plurality of memory cells to be read.

* * * * *